(12) United States Patent
Roy

(10) Patent No.: US 9,793,312 B1
(45) Date of Patent: Oct. 17, 2017

(54) INSULATING WALL AND METHOD OF MANUFACTURING THE SAME

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/230,055

(22) Filed: Aug. 5, 2016

(30) Foreign Application Priority Data

Mar. 22, 2016 (FR) ..................... 16 52441

(51) Int. Cl.
*H01L 27/148* (2006.01)
*H01L 27/146* (2006.01)

(52) U.S. Cl.
CPC .... *H01L 27/14643* (2013.01); *H01L 27/1463* (2013.01); *H01L 27/14612* (2013.01); *H01L 27/14689* (2013.01)

(58) Field of Classification Search
CPC ......... H01L 27/14643; H01L 27/14689; H01L 27/14612; H01L 27/1463
See application file for complete search history.

(56) References Cited

U.S. PATENT DOCUMENTS

| | | | |
|---|---|---|---|
| 8,513,761 B2* | 8/2013 | Roy | .................... H01L 27/1463 257/229 |
| 9,236,407 B2 | 1/2016 | Roy et al. | |
| 2005/0069293 A1 | 3/2005 | Monoi | |
| 2006/0006436 A1* | 1/2006 | Mouli | ............... H01L 27/14601 257/290 |
| 2007/0210418 A1 | 9/2007 | Nakajima | |
| 2009/0003105 A1 | 1/2009 | Itoh et al. | |
| 2009/0065904 A1* | 3/2009 | Wang | ................. H01L 21/76898 257/621 |
| 2009/0266973 A1* | 10/2009 | Roy | .................... H01L 27/1463 250/206 |

(Continued)

FOREIGN PATENT DOCUMENTS

EP  2752878  7/2014
JP  2010114461 A  5/2010

OTHER PUBLICATIONS

INPI Search Report and Written Opinion for FR 1652441 dated Nov. 11, 2016 (7 pages).

*Primary Examiner* — Victor A Mandala
(74) *Attorney, Agent, or Firm* — Gardere Wynne Sewell LLP

(57) ABSTRACT

A pixel includes a semiconductor layer with a charge accumulation layer extending in the semiconductor layer. A transistor has a read region penetrating into said semiconductor layer down to a first depth. An insulating wall penetrates into the semiconductor layer from an upper surface and containing an insulated conductor connected to a node of application of a potential. The insulating wall includes at least a portion provided with a deep insulating plug penetrating into the insulated conductor down to a second depth greater than the first depth. A continuous portion of the insulating wall laterally delimits, at least partially, a charge accumulation area and includes a wall portion with the deep insulating plug at least partially laterally delimiting the read region of the transistor.

12 Claims, 8 Drawing Sheets

(56) References Cited

U.S. PATENT DOCUMENTS

| | | | |
|---|---|---|---|
| 2011/0096208 A1* | 4/2011 | Roy | H01L 27/14603 348/243 |
| 2012/0018618 A1* | 1/2012 | Roy | H01L 27/14603 250/208.1 |
| 2012/0161213 A1* | 6/2012 | Roy | H01L 27/14603 257/292 |
| 2013/0015910 A1* | 1/2013 | Tubert | H04N 5/372 327/534 |
| 2013/0175594 A1 | 7/2013 | Basker et al. | |
| 2014/0054662 A1* | 2/2014 | Yanagita | H01L 27/14685 257/291 |
| 2014/0183685 A1* | 7/2014 | Roy | H01L 27/14603 257/443 |
| 2014/0347538 A1* | 11/2014 | Toda | H01L 27/14603 348/308 |
| 2015/0001623 A1 | 1/2015 | Wang et al. | |
| 2015/0002718 A1* | 1/2015 | Nomura | H04N 5/37213 348/311 |
| 2015/0061006 A1 | 3/2015 | Shinohara et al. | |
| 2015/0228693 A1* | 8/2015 | Toda | H01L 27/14612 257/40 |
| 2015/0279878 A1* | 10/2015 | Ahmed | H01L 27/1463 257/446 |
| 2015/0372031 A1* | 12/2015 | Yoon | H01L 27/14603 257/446 |
| 2016/0056200 A1* | 2/2016 | Lee | H01L 27/1463 250/208.1 |
| 2016/0118432 A1* | 4/2016 | Cazaux | H01L 27/14605 257/448 |
| 2016/0126271 A1* | 5/2016 | Sakurano | H01L 27/14643 257/292 |
| 2016/0133742 A1* | 5/2016 | Okuda | H01L 29/7813 257/330 |
| 2016/0148925 A1* | 5/2016 | Tonazzo | H01L 27/0259 257/361 |
| 2017/0062495 A1* | 3/2017 | Huang | H01L 27/1463 |
| 2017/0062610 A1* | 3/2017 | Agam | H01L 29/7823 |

* cited by examiner

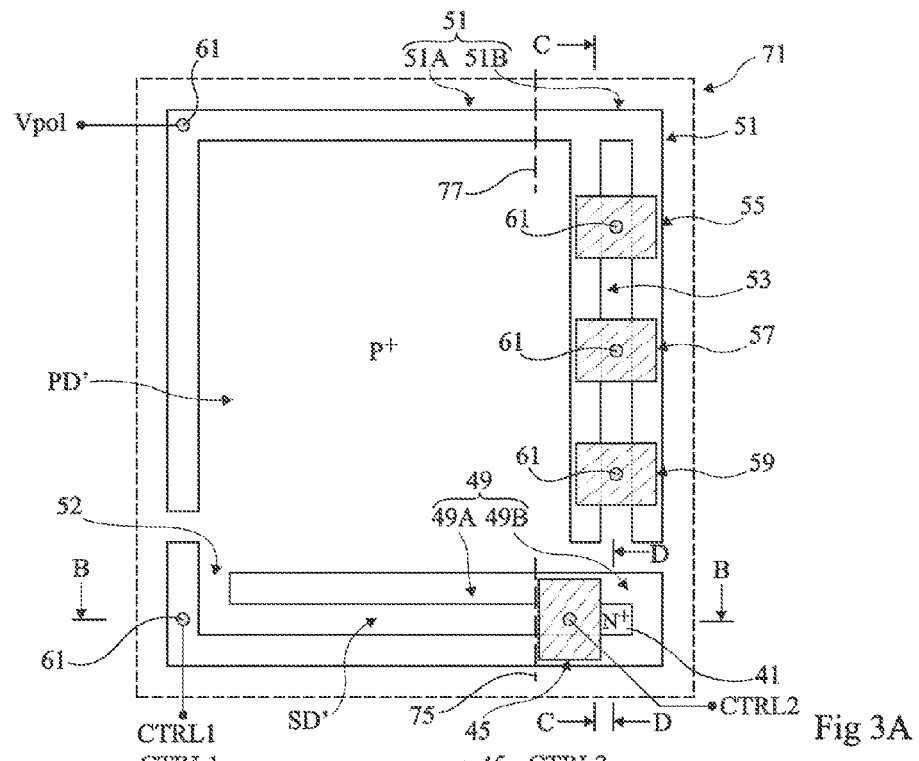
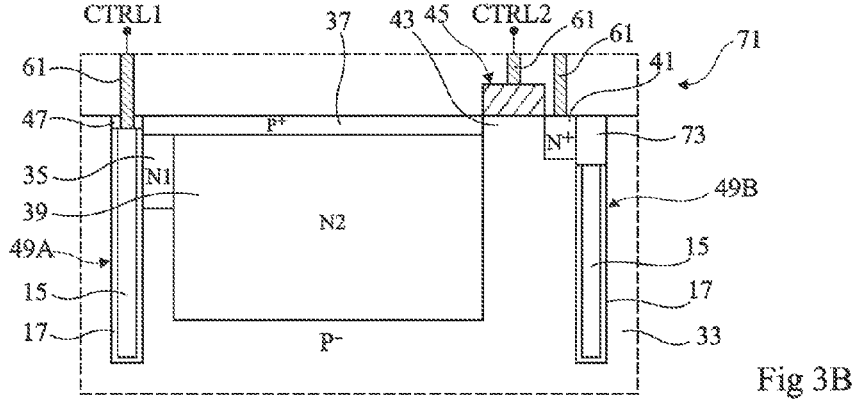
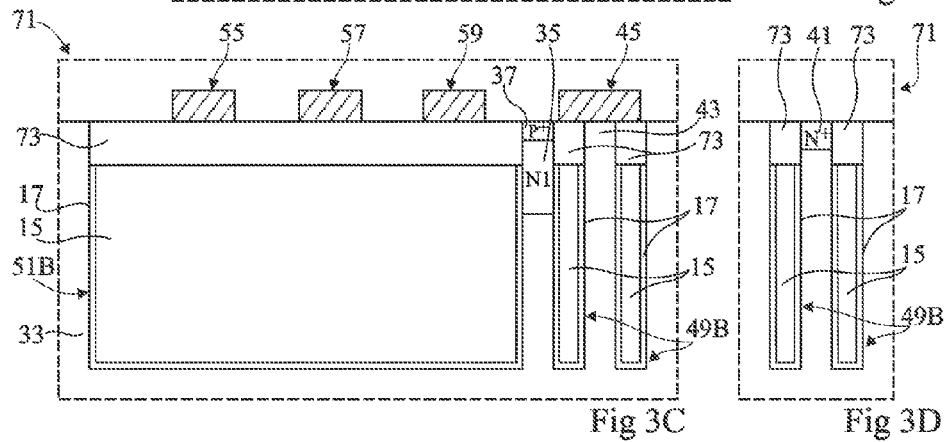
Fig 3A  Fig 3B  Fig 3C  Fig 3D

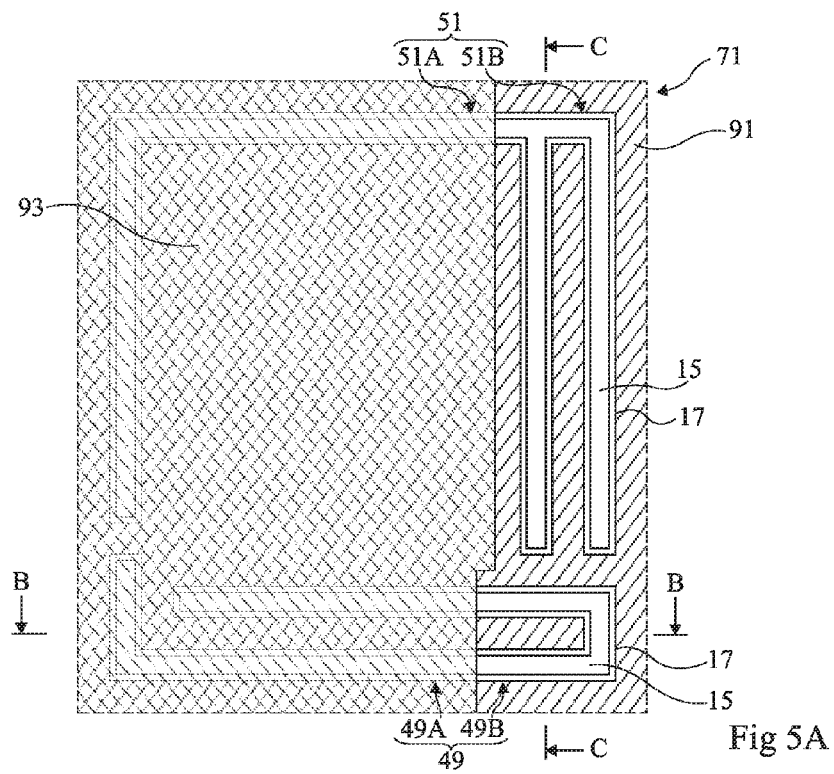
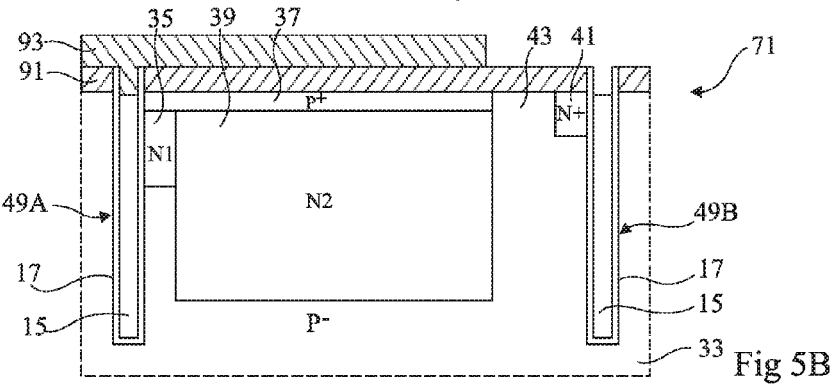
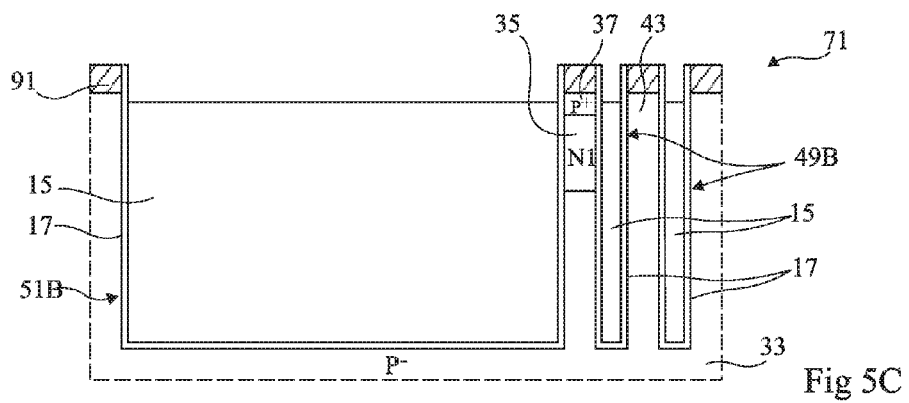

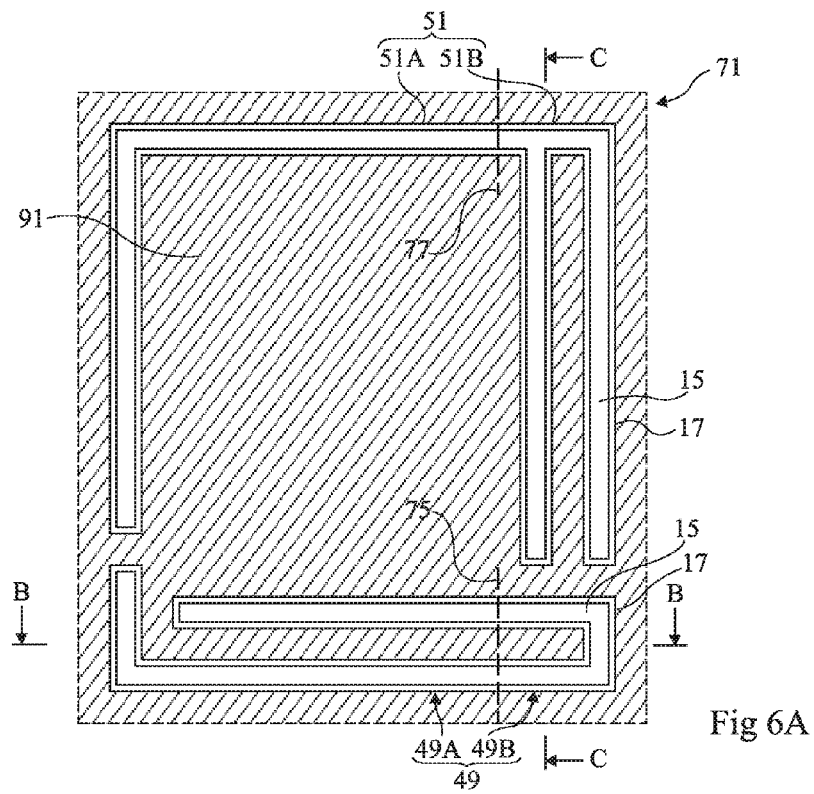
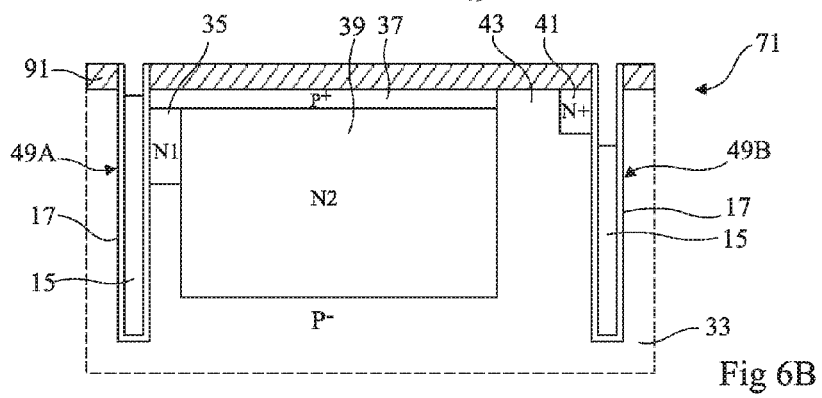
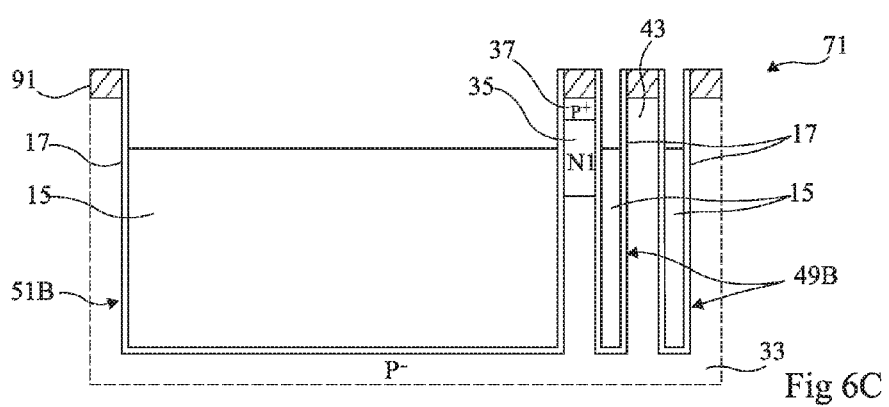

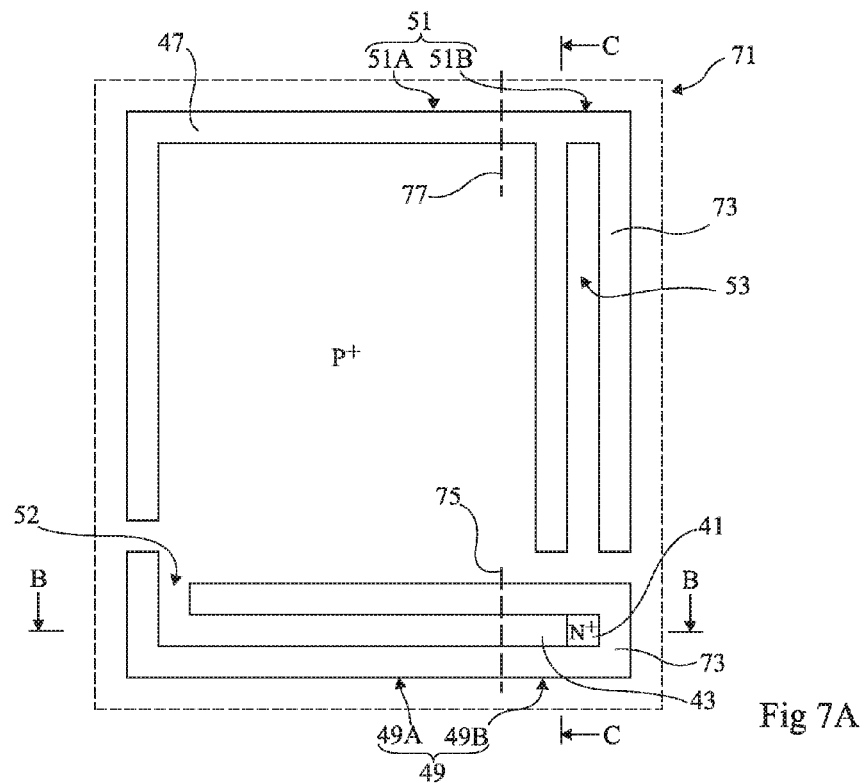
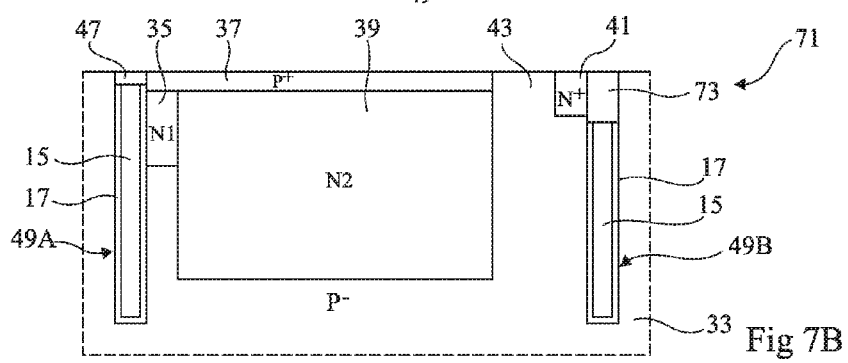
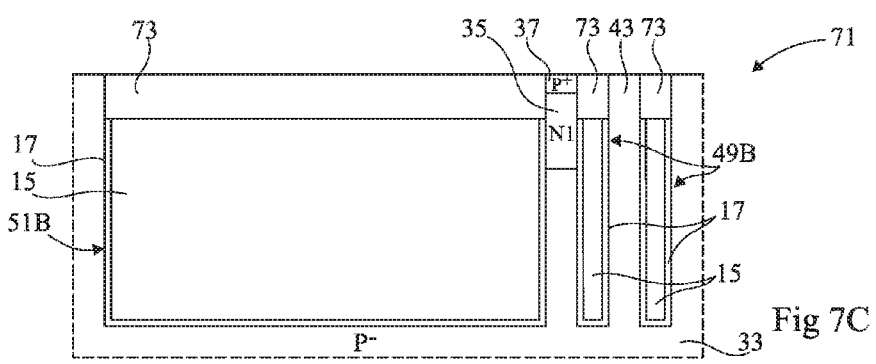
Fig 7A
Fig 7B
Fig 7C

INSULATING WALL AND METHOD OF MANUFACTURING THE SAME

PRIORITY CLAIM

This application claims the priority benefit of French Application for Patent No. 1652441, filed on Mar. 22, 2016, the disclosure of which is hereby incorporated by reference in its entirety to the maximum extent allowable by law.

TECHNICAL FIELD

The present disclosure relates to an insulating wall and to a method of manufacturing the same.

BACKGROUND

In many integrated circuits, and in particular in pixels, insulating walls are arranged between semiconductor regions to insulate them from one another. The case where the insulating walls are made of an insulated conductor, that is, where they are formed in a trench having its walls and its bottom coated with an insulating material, and being filled with a conductive material, is here more particularly considered.

FIGS. 1A, 1B, and 1C illustrate an example of a pixel 1 comprising an insulating wall made of an insulated conductor, FIG. 1A being a top view of the pixel and FIGS. 1B and 1C being cross-section views of the pixel along respective planes BB and CC of FIG. 1A. This example corresponds to an embodiment of a pixel described in U.S. application patent Ser. No. 15/136,569 filed Apr. 22, 2016 (corresponding to French Application for Patent No. 15/60422 filed Oct. 30, 2015) incorporated by reference.

Pixel 1 is a pixel of an image sensor adapted to a so-called global shutter control mode, and comprises a photosensitive area, a charge storage area, or memory area, and a read area coupled to a read circuit. In a global shutter control mode, the photogenerated charges accumulated during an integration phase in the photosensitive area of each sensor pixel are simultaneously transferred into the corresponding memory area and a complete image is then stored in all the memory areas. The stored image can then be read, during the next integration phase, by transferring the charges stored in the memory areas to the corresponding read areas.

Pixel 1 is formed inside and on top of a lightly-doped P-type semiconductor substrate 3 (P−). The photosensitive area of pixel 1 comprises an N-type doped well 5 of doping level N1. At the upper surface of the substrate, well 5 is coated with a heavily-doped P-type thin layer 7 (P+). Well 5 thus forms with substrate 3 the junction of a vertically pinned photodiode, or photosite, PD. The memory area of pixel 1 comprises an N-type doped well 9 of doping level N2, well 9 being coated with P+-type thin layer 7. Well 9 thus forms with substrate 3 the junction of a vertically pinned photodiode SD. The dimensions and doping levels N1 and N2 of wells 5 and 9 are selected so that the storage capacity of diode SD is greater than or equal to that of photodiode PD.

The memory area is adjacent to an edge of the photosensitive area (at the bottom of FIG. 1A) and extends lengthwise in a direction parallel to this edge. The memory area is laterally delimited by two separate portions, or insulated vertical electrodes, 11 and 13 of an insulating wall made of a conductive material 15 coated with a layer of an insulating material 17. The insulating wall penetrates into the substrate down to a depth greater than or equal to that of well 9. Electrode 11 is arranged between the photosensitive area and the memory area, and fully delimits a first large side of the memory area. Electrode 13 comprises a portion 13A, parallel to electrode 11, fully delimiting the second large side of the memory area. At a first end of the memory area, electrode 13 further comprises an extension 13B extending from portion 13A to the photosensitive area to be opposite a first end of electrode 11 (on the left-hand side of FIG. 1A). The end of electrode 11 and the opposite portion of extension 13B define an opening 19 between the photosensitive area and the memory area, having well 5 of the photosensitive area extending therethrough all the way to well 9 of the memory area.

The rear area of pixel 1 comprises a semiconductor region 21 more heavily N-type doped (N+) than wells 5 and 9. Region 21 extends in substrate 3 from the upper surface thereof, down to a depth smaller than that of well 9. Region 21 is arranged at the second end of the memory area (on the right-hand side of FIG. 1A), opposite well 9 in line with the memory area. A portion 23 of the substrate separates well 9 from region 21. An insulated horizontal gate, or control gate, is arranged on top of and in contact with portion 23 of the substrate. This gate forms the gate of a MOS transistor 25 having its channel-forming region corresponding to portion 23 of substrate 3, and having its source and drain regions corresponding to well 9 and to region 21. Thus, the memory area extends from the photosensitive area to transistor 25.

The insulating wall further comprises an insulated portion or vertical electrode 27, separate from electrodes 11 and 13, and an insulated portion of vertical electrode 29, separate from electrodes 11, 13, and 27. Electrode 27 delimits most of the sides of the photosensitive area which are not bordered with the memory area. Electrode or counter-electrode 29 extends parallel to electrode 11, from an edge of the photosensitive area, beyond the second end of electrode 11 (on the right-hand side of FIG. 1A), to stop before the first end of electrode 11 (on the left-hand side of FIG. 1A). Electrode 29 partially delimits the photosensitive area on the side of the memory area.

To form electrodes 11, 13, 27, and 29, trenches vertically penetrating into substrate 3 from the upper surface thereof are etched, according to a pattern corresponding to the desired electrode shape. The lateral walls and the bottom of the trenches are coated with insulating material 17, after which the trenches are filled with conductive material 15.

Metallizations (not shown) electrically connect conductor 15 of electrodes 11 and 13 to a node CTRL1, conductor 15 of electrodes 27 and 29 to a node VPol, the gate of transistor 25 to a node CTRL2, and the upper surface of region 21 to a node SN of the pixel read circuit (not shown). The control potentials applied to nodes CTRL1 and CTRL2 of the pixel are provided by a pixel control circuit which may be common to a plurality of pixels of the sensor.

Pixel 1 is intended to receive an illumination on the upper surface or front surface side of substrate 3 and comprises a screen opaque to light (not shown) located on its upper surface side and masking the entire surface of the pixel except its photosensitive area.

The operation of pixel 1 will now be described.

In integration phase, substrate 3 and nodes $V_{Pol}$ and CTRL1 are at a same reference voltage. This potential may be the ground potential, or may be negative with respect to ground, for example, in the order of −1 V. Such an electrode biasing causes an accumulation of holes along the walls of these electrodes, particularly in opening 19. The dimensions of opening 19, of layer 7, and of wells 5 and 9, as well as the doping levels of substrate 3, of layer 7, and of wells 5 and 9 are selected so that, in the absence of illumination and of photogenerated charges, wells 5 and 9 are fully depleted, in particular at the level of opening 19 where the depletion potential of well 5 is lower than the depletion potential of the rest of well 5. A potential well then forms in well 5 and a potential well forms in well 9. The potential levels of these wells depend on the doping levels and on the bias potentials of the electrodes and of the substrate. When pixel 1 is illuminated, electron/hole pairs are photogenerated in photodiode PD, and the photogenerated electrons are attracted and trapped in well 5, which then forms a charge accumulation area. At the level of opening 19, well 5 remains fully depleted, which blocks electron exchanges between well 5 and well 9.

In a phase of transfer of the electrons accumulated in well 5 of photodiode PD to well 9 of the memory area, node CTRL1 is set to a sufficiently high voltage, for example, in the range from 2 to 4 V, to set the potential of well 5 at the level of opening 19 to a potential higher than the maximum potential of the potential well in photodiode PD during the integration phase, and to set the maximum potential of the potential well in well 9 to a potential higher than that in well 5 at the level of opening 19. As a result, all the photogenerated electrons contained in well 5 to well 9, via opening 19 are transferred. During the transfer phase, node $V_{Pol}$ and substrate 3 remain at the same reference potential as during the integration phase.

To read the electrons stored in the memory area, transistor 25 is set to a conductive state, which causes the transfer of electrons from well 9 to region 21 coupled to the pixel read circuit. The rest of the time, transistor 25 is in a non-conductive state, which prevents the passing of electrons from the memory area to region 21.

A disadvantage of pixel 1 is that region 21 coupled to node SN and portion 23 of substrate 3 are not laterally delimited by an insulating structure. As a result, charges may be lost during a charge transfer from the memory area to region 21. Further, charges photogenerated and accumulated in the photosensitive area may reach region 21 without having been previously transferred into the memory area. Counter-electrode 29 enables to limit such direct charge exchanges between the photosensitive area and the read area, but this causes a decrease in the photosensitive area of the pixel.

It would thus be desirable to have an insulating wall which enables to delimit semiconductor regions of a pixel and which overcomes at least some of the disadvantages of existing insulating walls.

SUMMARY

Thus, an embodiment provides a pixel comprising a semiconductor layer; a charge accumulation layer extending in the semiconductor layer; a transistor having a source or drain region penetrating into said layer down to a first depth; an insulating wall penetrating into said layer from its upper surface and containing an insulated conductor connected to a node of application of a potential, the wall comprising at least a portion provided with a deep insulating plug penetrating into the conductor down to a second depth greater than the first depth; and a continuous portion of the wall laterally delimiting, at least partially, the charge accumulation area, and comprising a portion of deep plug wall at least partially laterally delimiting the source or drain region of said transistor.

According to an embodiment, the pixel further comprises a charge storage area extending from the charge accumulation area to said transistor, the charge storage area being at least partially delimited by the continuous portion of the wall, said transistor being at least partially laterally delimited by the deep plug portion of the continuous portion of the wall.

According to an embodiment, the channel-forming region of said transistor is at least partially delimited by the deep plug portion of the continuous portion of the wall.

According to an embodiment, said drain or source region of the transistor forms a read area of the pixel.

According to an embodiment, the continuous portion of the wall further comprises a portion provided with a shallower insulating plug penetrating into the conductive material down to a third depth smaller than the first depth.

According to an embodiment, the wall comprises another continuous portion comprising a wall portion with a shallower plug at least partially delimiting the photosensitive area.

According to an embodiment, the pixel further comprises another transistor formed inside and on top of the semiconductor layer in the vicinity of the photosensitive area, the other continuous portion further comprising a wall portion with a deep plug at least partially laterally delimiting said other transistor.

An embodiment provides a method of manufacturing a pixel formed inside and on top of a semiconductor layer, the method comprising the successive steps of:

a) forming, on the upper surface of said layer, a first mask provided with an opening;

b) etching a trench from the opening into said layer, forming an insulating coating on the walls thereof, and filling it with a conductor up to a first level lower than the upper level of the first mask;

c) in a portion of the trench, removing a portion of the conductor down to a second level lower than the first level and lower than the level of the upper surface of said layer; and d) forming an insulating material filling the trench up to a third level higher than or equal to the upper level of the first mask.

According to an embodiment, step b) comprises:

b1) after depositing the insulating coating, filling the trench with the conductor up to the upper level of the first mask; and b2) etching the conductor down to the first level.

According to an embodiment, step b1) comprises the successive steps of:

filling the trench with the conductor up to a fourth upper level of the first mask; and leveling by chem.-mech. polishing of the conductor down to the upper level of the first mask.

According to an embodiment, step c) comprises:

c1) forming a second mask covering the trench except for said portion of the trench; and c2) etching the conductor down to the second level.

According to an embodiment, step d) comprises:

d1) depositing the insulating material up to a fifth level higher than the third level; and d2) leveling by chemical mechanical polishing to remove the insulating material down to the third level.

According to an embodiment, the first level is lower than the level of the upper surface of said layer.

According to an embodiment, the third level is equal to the upper level of the first mask, the method further comprising, after step d), a step e) of removing the first mask.

According to an embodiment, the method further comprises, after step e), a step f) of leveling by chemical mechanical polishing to remove the insulating material down to the upper surface of said layer.

BRIEF DESCRIPTION OF THE DRAWINGS

The foregoing and other features and advantages will be discussed in detail in the following non-limiting description of specific embodiments in connection with the accompanying drawings, wherein:

FIGS. 3A to 3D schematically show an embodiment of a pixel;

FIGS. 4A to 4C, 5A to 5C, 6A to 6C, and 7A to 7C illustrate successive steps of an embodiment of a method of manufacturing the pixel of FIGS. 3A to 3D.

DETAILED DESCRIPTION

Figure 1A:
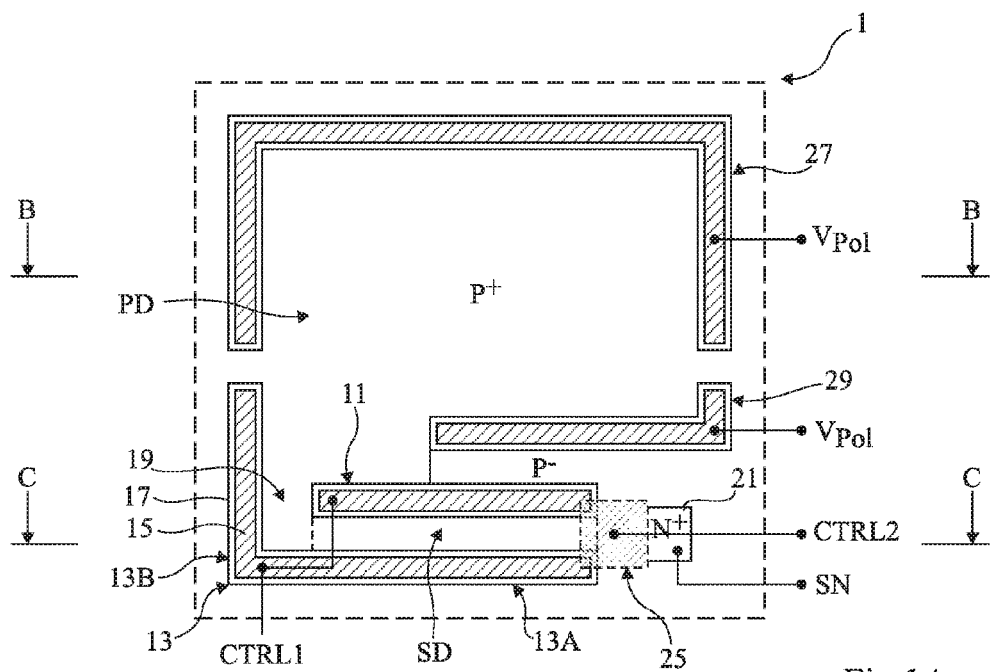
FIGS. 1A to 1C, previously described, schematically show an example of a pixel.

The same elements have been designated with the same reference numerals in the various drawings and, further, the various drawings are not to scale. For clarity, only those steps and elements which are useful to the understanding of the described embodiments have been shown and are detailed.

In the following description, terms "left", "right", "top", "over", "upper", "lower", "horizontal", "vertical", "bottom", "top", etc. refer to the orientation of the concerned elements in the corresponding drawings.

Figure 2A:
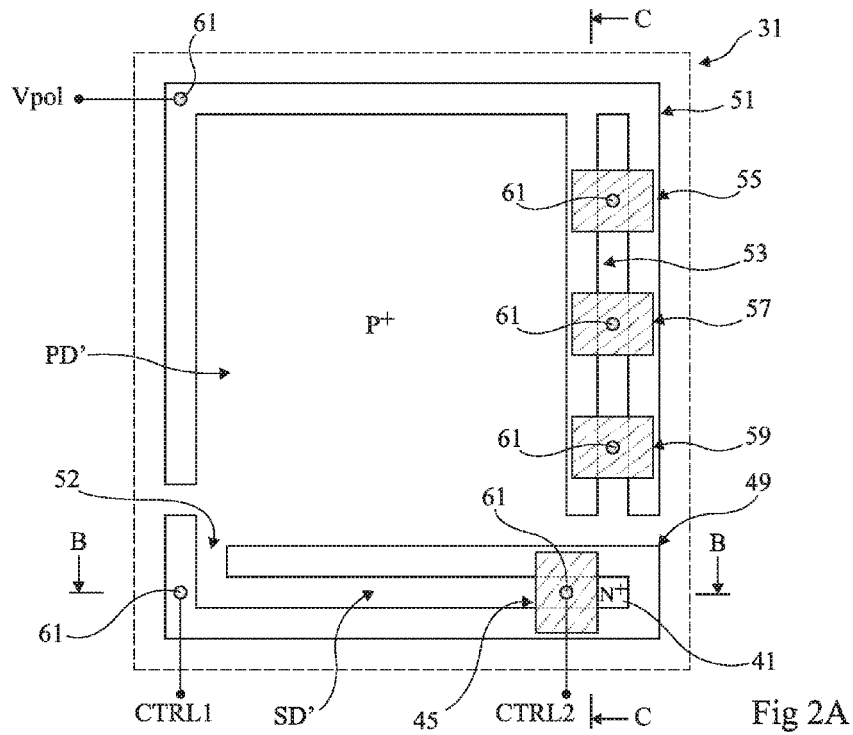
FIGS. 2A to 2C schematically show another example of a pixel.
Figure 2B:
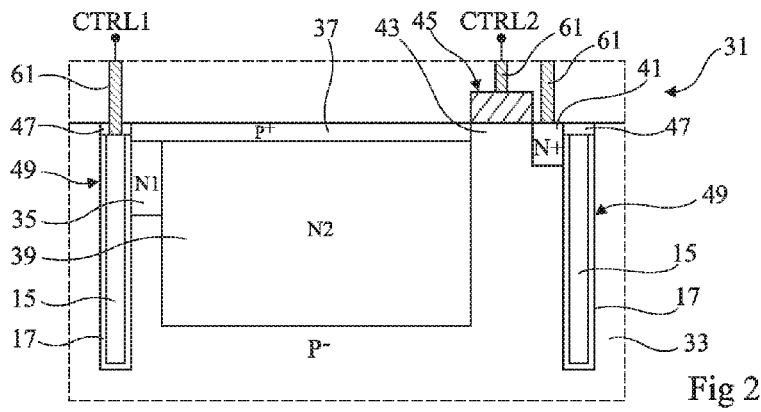
Figure 2C:
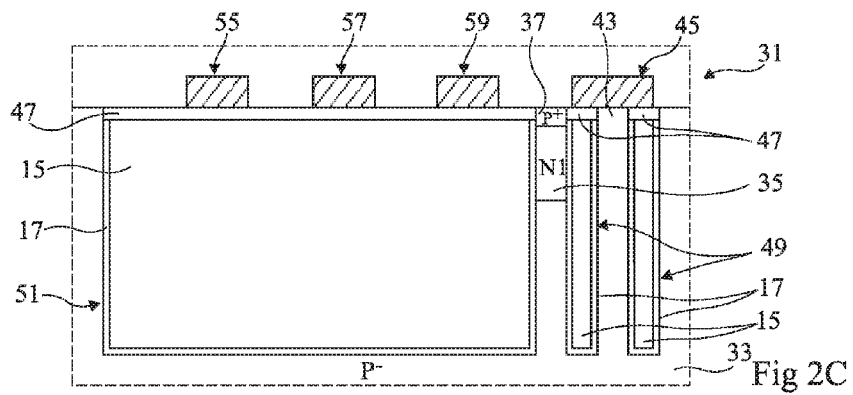

FIGS. 2A to 2C show an example of a pixel 31 adapted to a global shutter control and comprising an insulating wall made of an insulated conductor.

The pixel is formed inside and on top of a lightly-doped P-type semiconductor substrate, or semiconductor layer, 33 (P−), substrate 33 being for example made of silicon. Similarly to pixel 1, pixel 31 comprises a photosensitive area, a memory area, and a read area coupled to a read circuit of the pixel. The photosensitive area of pixel 31 comprises an N-type doped well 35 of doping level N1, coated, on the upper surface of substrate 33, with a heavily-doped P-type thin layer 37 (P+). Well 35 thus forms with substrate 33 the junction of a vertically pinned photodiode PD'. The memory area of pixel 31 is adjacent to an edge of the photosensitive area and extends lengthwise in a direction parallel to this edge. The memory area comprises an N-type doped well 39 of doping level N2, coated with thin layer 37. Well 39 thus forms with substrate 33 the junction of a vertically pinned diode SD'. The dimensions of layer 37 and of wells 35 and 39, and the doping levels of substrate 33, of layer 37, and of wells 35 and 39 are selected similarly to those of substrate 3, of layer 7, and of wells 5 and 9 of pixel 1. The read area of pixel 31 comprises a heavily-doped N-type region 41 (N+) extending into substrate 33 from the upper surface thereof, down to a depth smaller than that of well 39. Read area 41 is arranged on the side of a first end of the memory area (on the right-hand side of FIG. 2A), opposite well 39, continuing the memory area, a portion 43 of substrate 33 separating well 39 from read area 41. A control gate arranged on top of and in contact with portion 43 of the substrate forms the gate of a MOS transistor 45 having its off or on state conditioning the transfer of photogenerated charges accumulated in the memory area to read region 41.

Like pixel 1, pixel 31 comprises an insulating wall made of a conductive material 15 coated with a layer of an insulating material 17. The insulating wall penetrates into substrate 33 down to a depth at least equal, preferably greater, than that of the deepest well delimited by the wall, in this example, well 39. Further, the insulating wall of pixel 31 is provided with an insulating plug 47 penetrating into conductive material 15. As shown, plug 47 may penetrate into conductor 15 from the upper surface of substrate 33. In an alternative embodiment, not shown, substrate 33 is covered with a hard mask made of an insulating layer and the insulating wall comprising conductive 15 and insulator 17 extends from the level of this hard mask. In this variation, plug 47 may possibly not extend all the way to the upper surface of the substrate.

In the example illustrated in FIGS. 2A to 2C, the insulating wall of pixel 31 comprises two separate portions, or insulated vertical electrodes, 49 and 51.

A first portion of electrode 49, corresponding to electrode 11 of pixel 1, totally delimits a first large side of the memory area on the side of the photosensitive area. A second portion of electrode 49, corresponding to electrode 13 of pixel 1, totally delimits the second large side of the memory area. On the side of the second end of the memory area (on the left-hand side of FIG. 2A), the second portion of electrode 49 extends all the way to the photosensitive area to be opposite the end of the first portion of electrode 49. The first and second portions of electrode 49 thus define an opening 52 having well 35 extending therethrough all the way to well 39. The dimensions of opening 52 are selected similarly to those of opening 19 of pixel 1. Further, unlike pixel 1, a third portion of electrode 49 connects the first and second portions of electrode 49 on the side of the first end of the memory area (on the right-hand side of FIG. 2A). This third portion of electrode 49 laterally surrounds and delimits portion 43 of substrate 33 and read region 41. In top view, this third portion of electrode 49 for example has a U shape with a first arm arranged in line with the first portion of electrode 49, with a second arm arranged in line with the second portion of electrode 49, and having the bar connecting the two arms delimiting the side of read region 41 opposite to the memory area. The gate of transistor 45 partly rests on electrode 49.

Electrode 51 comprises a first portion delimiting most of the sides of the photosensitive area which are not bordered by the memory area. This first portion of electrode 51 for example has the shape of a U having its horizontal bar delimiting the side of the photosensitive area opposite to the side bordered with the memory area. In this example, electrode 51 comprises a second portion, or extension, at least partially delimiting a region 53 of substrate 33 having MOS transistors 55, 57, and 59 formed therein, only the gates thereof being shown. The gates of transistors 55, 57, and 59 partly rest on insulating plug 47 of the insulating wall. In this example, region 53 has a rectangular shape in top view, is adjacent to an edge of the photosensitive area (on the right-hand side of FIG. 2A), and extends lengthwise parallel to this edge. The two large sides and a first small side of region 53 are totally delimited by electrode 51. On the side of its second small side, region 53 is not delimited by electrode 51. Transistors 55, 57, and 59 are for example the follower and line selection transistors of a read circuit associated with pixel 31 and the transistor for resetting N+ read node 41. In this example, the source and drain regions, not shown, of transistors 55, 57, and 59 of read region 41 of transistor 45 penetrate into substrate 33 down to substantially equal depths.

Electrodes 49 and 51 have been formed by etching of trenches through openings of a hard mask resting on the upper surface of substrate 33, deposition of insulating material 17 on the trench walls, filling of the trenches with conductive material 15, and leveling by chemical mechanical polishing (CMP) down to the upper surface of the hard mask. After these steps, conductive material 15 has been removed from the top of the entire electrode 49 and from the entire electrode 51 down to a level lower than that of the upper surface of substrate 33. Plug 47 is then formed by deposition of an insulating material, followed by a step of leveling by CMP down to the upper surface of hard mask 91 or of substrate 33. In an alternative embodiment, not shown, the removal of the conductive material from the top of electrodes 49 and 51 may be stopped at an intermediate level of the hard mask, and the CMP step following the deposition of the insulating mask is then stopped on the hard mask. In the case where the step of CMP of the insulating material is stopped on the hard mask, the latter may be left in place.

Figure 1B:
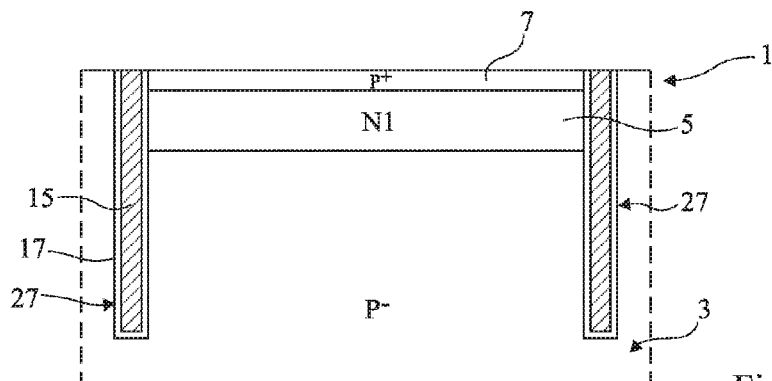
Figure 1C:
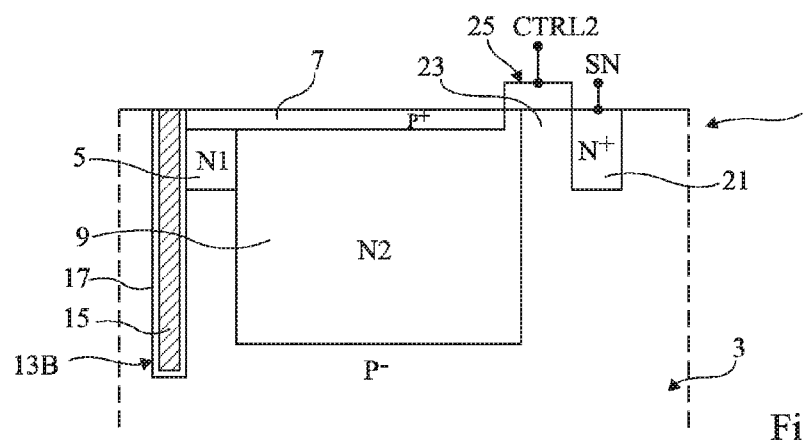

Metallization levels, not shown, and vias 61, only some of which are shown, cross plug 47 and electrically connect conductive material 15 of electrode 49 to a node CTRL1, and conductive material 15 of electrode 51 to a node $V_{Pol}$. Vias 61 connect the gate of transistor 45 to a node CTRL2 and the upper surface of read region 41 to the pixel read circuit, for example, to the gate of transistor 57. The operation of pixel 31 is similar to that of pixel 1 described in relation with FIGS. 1A to 1C. In particular, when electrodes 49 and 51 are negatively biased, holes accumulate along their walls, all along the height of well 35 and all along the height of well 39, which avoids for electrons to recombine at the level of these walls. To achieve this, plug 47 only penetrates into conductive material 15 down to an intermediate level of P+ layer 37.

In pixel 31, N+ read region 41 and channel-forming region 43 of transistor 45 are separated from the photosensitive area by electrode 49, which limits or prevents direct charge exchanges between the photosensitive area and regions 41 and 43. Thus, unlike in pixel 1, it is not necessary to provide a counter electrode 29 in pixel 31. As a result, for pixels 1 and 31 having similar surface areas, the photosensitive area of pixel 31 may be larger than that of pixel 1.

Electrodes 49 and 51 at least partially delimit source, drain, and channel-forming regions of the pixel transistors. However, plug 47 only penetrates into conductive material 15 down to an intermediate level of the semiconductor transistor regions, particularly of N+ read region 41 of transistor 45. As a result, in operation, capacitive couplings occur between such semiconductor transistor regions and conductive material 15. Such capacitive couplings may result in incomplete charge transfers between the memory area and N+ read area 41, and/or in a degradation of the electrostatic control of the channel of these transistors.

To suppress such capacitive couplings, it could be provided to form shallow trench insulation structures (STI) formed of shallow trenches filled with an insulating material.

In a first case, a shallow trench insulation structure may be provided at the top of the portion of electrode 49 laterally delimiting semiconductor regions 41 and 43 of transistor 45. The shallow insulating structure would then penetrate into conductive material 15 down to a depth greater than or equal to that of read region 41. However, the forming of such a shallow trench insulation structure would cause an increase in the number of manufacturing steps of pixel 31. Further, this would raise problems of alignment between the shallow trench insulation structure and electrode 49. For example, the width difference between the shallow trench insulation structure and electrode 49 would result in the obtaining of a transistor 45 which would have a channel-forming region 43 with variable dimensions between the memory area and N+ read area 41, which is not desirable. Further, the etching of a shallow trench at the top of a portion of electrode 49 would require simultaneously etching portions of substrate 33, of plug 47, of insulator 17, and of conductive material 15, which would result in obtaining a shallow trench having a stepped bottom, and/or in the forming of short-circuits between conductive material 15 and neighboring semiconductor regions 41 and 43.

In a second case, a shallow trench insulation structure could replace the portion of electrode 49 laterally delimiting N+ read area 41 and channel-forming region 43 of transistor 45. However, at least some of the alignment problems discussed hereabove, and particularly at the junction between the shallow trench insulation structure and electrode 49, would then arise. Further, due to the fact that the shallow trench insulation structure would penetrate into the substrate less deeply than electrode 49, read region 41 would not be as well insulated from the photosensitive area as in pixel 31 described in relation with FIGS. 2A to 2C, and it might be necessary to provide a counter-electrode as in pixel 1.

The inventor here provides an insulating wall overcoming at least some of the disadvantages of existing insulating structures and in particular of the insulating wall of pixel 31.

FIGS. 3A, 3B, 3C, and 3D schematically show an embodiment of a pixel 71 identical to pixel 31 except that, in pixel 71, the insulating wall comprises at least a portion provided with shallow insulating plug 47 such as described in relation with FIGS. 2A to 2C, and at least a portion provided with an insulating plug 73 penetrating more deeply into conductive material 15.

More particularly, in pixel 71, continuous portion 49 of the insulating wall, or insulated vertical electrode 49, comprises a portion 49A with a shallow insulating plug 47 and a portion 49B with a deeper insulating plug 73, the limit between these two portions being materialized by a dotted line 75 in FIG. 3A. Portion 49A of electrode 49 defines opening 52 and totally laterally delimits the two large sides of the memory area and a portion of the photosensitive area (at the bottom of FIG. 3A). Via 61 enabling to electrically connect conductive material 15 of electrode 49 to node CTRL1 is arranged at the level of portion 49A of electrode 49, and advantageously crosses shallow insulating plug 47. Portion 49B of electrode 49 laterally delimits N+ read area 41 and channel-forming region 43 of transistor 45. Similarly, continuous portion 51 of the insulating wall, or insulated vertical electrode, 51 of pixel 71 comprises a portion 51A with a shallow insulating plug 47 and a portion 51B with a deeper insulating plug 73, the limit between these two portions being materialized by a dotted line 77 in FIG. 3A. Portion 51A of electrode 51 laterally delimits the sides (at the top and on the left-hand side of FIG. 3A), of the photosensitive area which are not bordered with the memory area or with region 53 of substrate 33 where transistors 55, 57, and 59 are formed. Via 61 enabling to electrically connect conductive material 15 of electrode 51 to node VPol is arranged at the level of portion 51A of the first type, and advantageously crosses shallow insulating plug 47. Portion 51B of electrode 51 laterally delimits the two large sides and the first small side (at the top of FIG. 3A) of region 53. In portions 49B and 51B of electrodes 49 and 51, deeper insulating plug 73 penetrates into conductive material 15, from the upper surface of substrate 33 in this embodiment, down to a depth equal to, preferably greater than, the depth down to which the source and drain regions of transistors 45, 55, 57, and 59 penetrate into the substrate. Thus, when conductive material 15 of electrode 49 is biased, there is no charge attraction by conductive material 15 at the level of regions 41 and 43 of transistor 45 due to the fact that these regions 41 and 43 are bordered all along their height by deep insulating plug 73 and not with conductive material 15 coated with insulator 17. Similarly, when conductive material 15 of electrode 51 is biased, there is no charge attraction by conductive material 15 at the level of the semiconductor regions of transistors 55, 57, and 59 due to the fact that the semiconductor regions are bordered all along their heights with deep insulating plug 73. In portions 49A and 51A of electrodes 49 and 51, when conductive material 15 of electrodes 49 and 51 is negatively biased, holes accumulate along the walls of these electrodes all along the height of well 35 and all along the height of well 39 due to the fact that plug 47 is shallow.

As an example, pixel 71 of FIGS. 3A to 3D may have the following dimensions:
  sides having a length in the range from 1 to 6 μm, for example, 3 μm, for a square photosensitive area in top view,
  a length between 1 and 6 μm, for example, 2.5 μm, and a width between 0.2 and 1 μm, for example, 0.3 μm, for the memory area,
  a width from 0.1 to 1 μm, for example, 0.2 μm, for opening 52,
  from 0.1 to 0.4 μm, for example, 0.275 μm, between the memory area and N+ read area 41,
  a thickness between 0.2 and 1 μm, for example, 0.5 μm for well 35,
  a thickness between 1 and 10 μm, and preferably between 2 and 4 μm, for well 39,
  a thickness between 0.1 and 0.5 μm for read area 41,
  a thickness between 0.1 and 0.6 μm for insulating plug 73,
  a thickness between 100 and 300 nm, for example, 200 nm, for P+-type doped thin layer 37,
  a thickness between 25 and 100 nm for insulating plug 47, and
  a depth between 1 and 10 μm, preferably between 2 and 5 μm, and a width between 0.1 and 0.5 μm for the insulating wall.

As an example, for a given manufacturing technology, the doping levels of the various regions of pixel 71 are the following:
  from $10^{17}$ to $10^{19}$ at·cm$^{-3}$, for example, $10^{18}$ at·cm$^{-3}$, for thin layer 37,
  from 1016 to $10^{18}$ at·cm$^{-3}$, for example, $10^{17}$ at·cm$^{-3}$, for well 35,
  from $10^{16}$ to $10^{19}$ at·cm$^{-3}$, for example, $10^{17}$ at·cm$^{-3}$, for well 39,
  from $10^{19}$ to $10^{22}$ at·cm$^{-3}$, for example, $10^{21}$ at·cm$^{-3}$, for read area 41, and
  from $10^{14}$ to $10^{19}$ at·cm$^{-3}$, for example, $10^{15}$ at·cm$^{-3}$, for well 33.

An embodiment of a method of manufacturing the insulating wall of pixel 71 will now be described in relation with FIGS. 4A to 4C, 5A to 5C, 6A to 6C, and 7A to 7C.

Figure 4A:
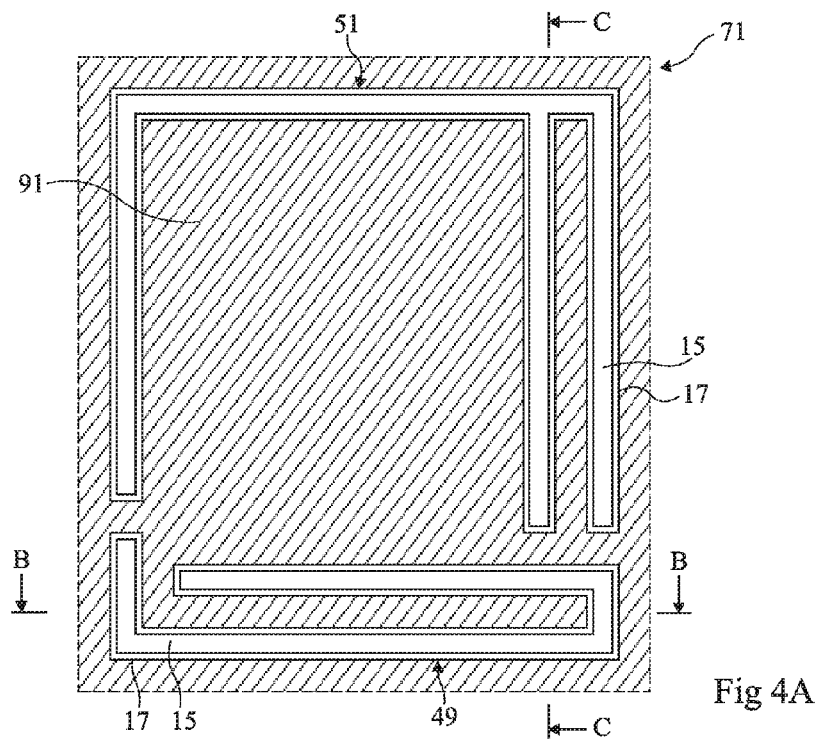
Figure 4B:
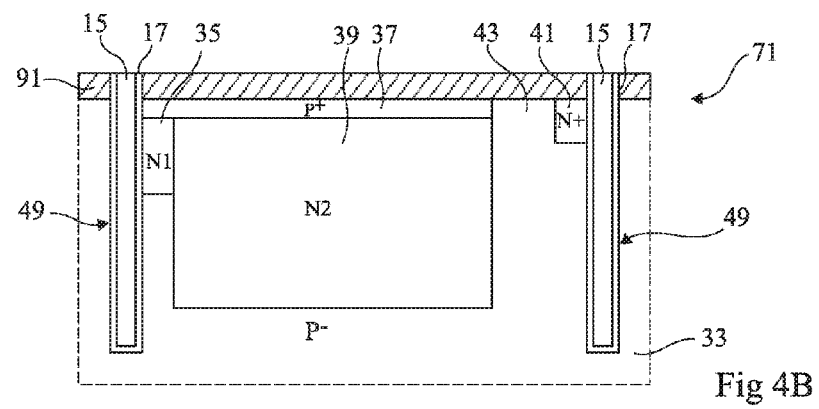
Figure 4C:
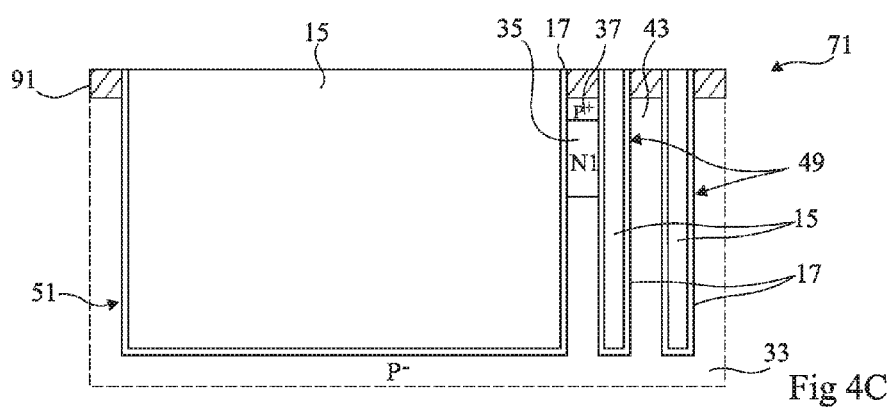

FIGS. 4A, 4B, and 4C schematically show pixel 71 at an intermediate manufacturing step, the views of FIGS. 4A, 4B, and 4C respectively corresponding to the views of FIGS. 3A, 3B, and 3C.

In this embodiment, at the step of FIGS. 4A to 4C, the various semiconductor regions of pixel 71 have been formed by steps conventional in microelectronic manufacturing methods.

A hard mask 91, for example, made of silicon oxide and/or of silicon nitride, has been formed on the upper surface of substrate 33, mask 91 comprising openings at the locations where portions or electrodes 49 and 51 of the insulating wall are desired to be formed. Insulating coating 17 comprising one or a plurality of insulating layers, for example, a silicon oxide layer, has been formed on the walls of the trenches. The trenches have then been filled with a conductive material, for example, doped polysilicon or a metal such as copper or tungsten. A CMP leveling step has then been carried out down to the upper surface of mask 91. An insulating wall made of an insulated conductor 15 (or insulator 17) comprising, in this example, two separate portions, or insulated vertical electrodes, 49 and 51, is thus obtained.

FIGS. 5A, 5B, and 5C schematically show pixel 71 of FIGS. 4A, 4B, and 4C at a subsequent manufacturing step. In the shown embodiment, material 15 has been etched down to a level lower than that of the upper surface of substrate 33, for example, down to an intermediate level of P+ layer 37. In an alternative embodiment, material 15 is etched down to an intermediate level of hard mask 91. Conductive material 15 has been selectively etched over insulator 17. In an alternative embodiment, conductive material 15 is selectively etched over substrate 33 and mask 91, and non-selectively over insulator 17, whereby insulator 17 is removed along the same height as material 15. A mask 93, for example, made of resin, has then been formed to cover portions 49A and 51A of the insulating wall where a shallow insulating plug 47 is desired to be formed, portions 49B and 51B of the insulating wall where a deeper insulating plug 73 is desired to be formed being left exposed.

FIGS. 6A, 6B, and 6C schematically show pixel 71 of FIGS. 5A, 5B, and 5C after partial etching of conductive material 15 in portions 49B and 51B of the insulating wall. In this embodiment, conductive material 15 has been selectively etched over insulator 17. In portions 49B and 51B of the insulating wall, conductive material 15 is etched down to a level lower than the low level of N+ read region 41 and/or of the source and drain regions of transistors 55, 57, and 59. Mask 93 has then been removed.

FIGS. 7A, 7B, and 7C schematically show pixel 71 of FIGS. 6A, 6B, and 6C after the deposition of an insulating material, for example, silicon oxide, all over pixel 71 to fill the top of the trenches at least all the way to the upper level of mask 91. The deposition of the insulating material has been followed by a step of chemical mechanical polishing (CMP) leveling down to the upper surface of hard mask 91, with an operational step of removing mask 91, and with an optional step of CMP leveling down to the upper surface of substrate 33. An insulating wall made of an insulated conductor comprising portions 49A and 51A provided with shallow plug 47 made of the insulating material, and portions 49B and 51B provided with deeper plug 73 made of the insulating material are thus obtained. In certain cases, it is desirable for plugs 47 and 73 to reach a level higher than that of the upper surface of the substrate and the optional CMP step may be omitted or stopped at a level higher than that of the upper surface of substrate 33. Further, hard mask 91 may be left in place, particularly in the case where the removal of conductive material 15 described in relation with FIGS. 5A to 5C is stopped at an intermediate level of hard mask 91.

At next steps, the gates of the various transistors 44, 55, 57, and 59 of pixel 71 are formed. Metallization levels (not shown) and vias 61 are then formed to electrically connect the different regions of pixel 71 as described in relation with FIGS. 3A to 3D. After these steps, pixel 71 such as shown in FIGS. 3A to 3D is obtained.

Advantageously, the above-described method enables to obtain plugs 47 and 73 having their edges aligned with the vertical walls of portions 49, 51 of the insulating wall, which would not be the case by forming shallow trench insulation structures (STI) in line with or at the top of the insulating wall.

Further, in the previously-described method, the forming of an insulating wall comprising portions 41A and 51A with a shallow insulating plug 47 and, further, portions 49B and 51B with a deeper insulating plug 73, only requires an additional non-critical masking and etch step with respect to the case where an insulating wall only comprising portions with a shallow plug 47 would be formed, as in pixel 31 described in relation with FIGS. 3A to 3D.

Figure 8:
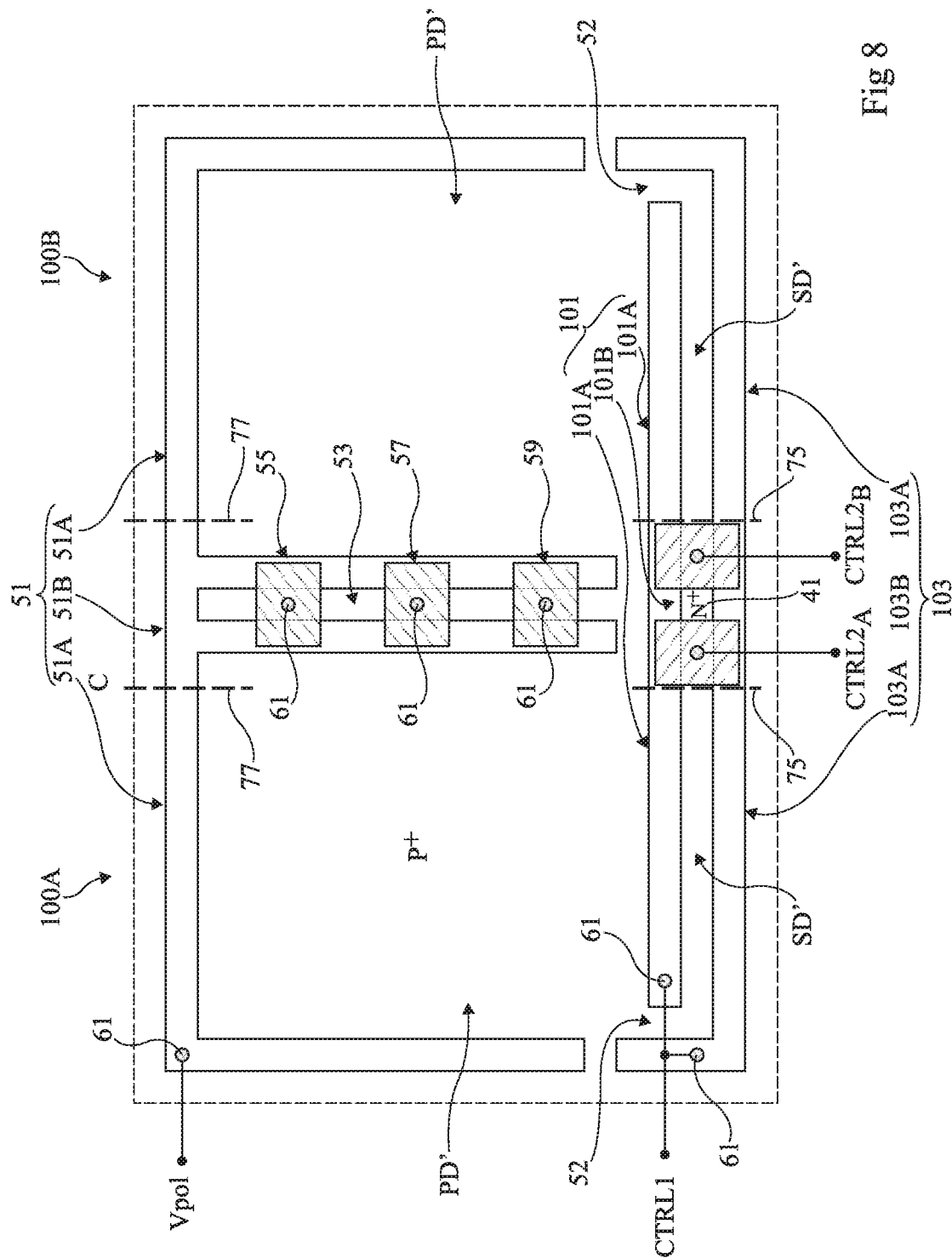
FIG. 8 schematically shows an embodiment of a device comprising two pixels of the type in FIGS. 3A to 3D.

FIG. 8 is a top view schematically showing an embodiment of a device comprising two pixels 100A and 100B similar to pixel 71 of FIGS. 3A to 3D.

The two pixels 100A and 100B share the same N+ read area 41 and the same region 53 of substrate 33 where transistors 55, 57, and 59 are formed. Transistors 55, 57, and 59 for example correspond to the transistors of a read circuit common to the two pixels 100A and 100B. In this device, portion 51 of the insulating wall, or insulated vertical electrode 51, delimiting the photosensitive area of pixel 100A and region 53 of substrate 33 also delimits the photosensitive area of pixel 100B. Further, portion 49 of the insulating wall, or insulated vertical electrode 49, is replaced with two separate portions 101 and 103 of the insulating wall, or insulated vertical electrodes 101 and 103. On the side of the photosensitive areas of pixels 100A and 100B, electrode 101 delimits the first large side of the memory areas of these pixels. Electrode 101 also delimits a side of shared N+ read area 41 and of regions 43 (not shown in FIG. 8) of the substrate having the gates of transistors 45 of pixels 100A and 100B formed thereon. Electrode 103 delimits, on the side opposite to the photosensitive areas, the second large side of the memory areas of pixels 100A and 100B. Electrode 103 also delimits a side of shared N+ read area 41 and of regions 43. Electrode 103 extends at its two ends to define, with the ends of electrode 101, openings 52 of pixels 100A and 100B.

Metallization levels, not shown, and conductive vias 61 enable to connect conductive material 15 of electrodes 101 and 103 to a node CTRL1, conductive material 15 of electrode 51 to a node $V_{Pol}$, the gate of transistor 45 of pixel 100A to a node $CTRL2_A$, the gate of transistor 45 of pixel 100B to a node $CTRL2_B$, and the upper surface of read region 41 to the pixel read circuit, for example, to the gate of transistor 57. The operation of pixels 100A and 100B is similar to that of pixel 71. In particular, the potential of node CTRL1 enables to control the simultaneous transfer of the photogenerated electrons accumulated in the photosensitive areas of pixels 100A and 100B to the corresponding memory area, the potential of node $CTRL2_A$ enables to control the transfer of the electrons accumulated in the memory area of pixel 100A to read area 41, and the potential of node $CTRL2_B$ enables to control the transfer of the electrons accumulated in the memory area of pixel 100B to read area 41.

In this device, similarly to what has been described in relation with FIGS. 3A to 3D, electrodes 101 and 103 comprise portions, respectively 101A and 103A, provided with shallow insulating plug 47 and laterally delimiting memory areas, and portions, respectively 101B and 103B, provided with deeper plug 73 and laterally delimiting channel-forming regions 43 (not shown in FIG. 8) and N+ read area 41 of transistors 45. The limit between portions 101A, 103A, and 101B, 103B is materialized in FIG. 8 by dotted lines 75. Similarly, electrode 51 comprises a portion 51A provided with shallow insulating plug 47 and laterally delimiting sides of the photosensitive areas of pixels 100A and 100B, and a portion 51B provided with deeper insulating plug 73 and laterally delimiting region 53 common to the two pixels 100A and 100B. The limit between portions 51A and 51B is materialized in FIG. 8 by dotted lines 77.

Specific embodiments have been described. Various alterations, modifications, and improvements will occur to those skilled in the art. In particular, it will be within the abilities of those skilled in the art to modify the shape and the arrangement of the previously-described insulating wall. For example, portion 49 and portion 51 of the insulating wall of pixel 71 may penetrate in substrate 33 down to different depths. To achieve this, it may for example be provided to adapt the width of the openings of mask 91.

Although pixels formed inside and on top of a semiconductor substrate having the insulating wall penetrating into it have been described, these pixels may be formed from a SOI-type semiconductor layer, the insulating wall then penetrating into the SOI layer and possibly into the insulating layer and the substrate having the SOI layer resting thereon.

The previously-described embodiments correspond to the case where the charge accumulated and transferred are electrons. These embodiments may be adapted to the case where the charges are holes by inverting all conductivity types and by adapting the potentials applied to nodes $V_{pol}$, CTRL1, CTRL2, $CTRL2_A$ and $CTRL2_B$.

The insulating wall described in relation with the pixels of FIGS. 3A to 3D and 8 may be provided in other pixels, for example, in pixels comprising no memory area and being adapted to a rolling shutter control. More generally, such an insulating wall having its conductive material intended to be biased may be provided in a microelectronic device other than a pixel as soon as a first portion of this wall enables to insulate and to delimit in depth a charge accumulation area, and as a second portion of this wall delimits all or part of a semiconductor region of a MOS transistor, the first and second portions being continuous.

The number and the order of the steps of the method described in relation with FIGS. 3A to 7C may be modified. For example, the semiconductor regions of the pixel transistors may be formed after the forming of the insulating wall. Further, in an alternative embodiment of the previously-described method, mask 91 may be removed after the step of etching conductive material 15 and before the deposition of mask 93. In this case, the second etching of conductive material 15 will be performed selectively over substrate 33. An additional step of implantation of dopant atoms may be provided to form a heavily-doped P+-type layer along the walls of deeper plug 73 of portions 49B, 51B, 101B, and 103B of the insulating wall. This will advantageously enables to avoid for photogenerated charges to recombine at the level of the walls of deeper plug 73.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A pixel, comprising:
   a semiconductor layer;
   a charge accumulation area extending in the semiconductor layer;
   a transistor having a source or drain region penetrating into said semiconductor layer from an upper surface down to a first depth;
   an insulating wall penetrating into said semiconductor layer from the upper surface and containing an insulated conductor connected to a node of application of a potential, the insulating wall comprising at least a portion provided with a deep insulating plug penetrating into the insulated conductor from the upper surface down to a second depth greater than the first depth; and
   wherein a continuous portion of the insulating wall laterally delimits, at least partially, the charge accumulation area and comprises a wall portion with the deep insulating plug at least partially laterally delimiting the source or drain region of said transistor.

2. The pixel of claim 1, further comprising a charge storage area extending from the charge accumulation area to said transistor, the charge storage area being at least partially delimited by the continuous portion of the insulating wall, said transistor being at least partially laterally delimited by the wall portion with the deep insulating plug of the continuous portion of the insulating wall.

3. The pixel of claim 2, wherein a channel-forming region of said transistor is at least partially laterally delimited by the wall portion with the deep insulating plug of the continuous portion of the insulating wall.

4. The pixel of claim 1, wherein said drain or source region of the transistor forms a read area of the pixel.

5. The pixel of claim 1, wherein the continuous portion of the insulating wall further comprises a portion provided with a shallower insulating plug penetrating into the insulating conductor from the upper surface down to a third depth smaller than the first depth.

6. The pixel of claim 1, wherein the insulating wall comprises another continuous portion comprising a portion of a wall with a shallower plug laterally delimiting the photosensitive area.

7. The pixel of claim 6, further comprising another transistor formed inside and on top of the semiconductor layer in a vicinity of the photosensitive area, wherein the another continuous portion further comprises a portion of a wall with the deep insulating plug at least partially laterally delimiting said another transistor.

8. A pixel, comprising:
   a semiconductor layer;
   a photosensitive area of the semiconductor layer that is at least partially surrounded by a first insulated conductor wall penetrating into said semiconductor layer from an upper surface of the semiconductor layer, wherein the first insulated conductor wall includes a first portion provided with a first insulating plug at said upper surface, said first insulating plug having a first depth, and a second portion provided with a second insulating plug at said upper surface, said second insulating plug having a second depth greater than the first depth;
   a memory area of the semiconductor layer that is at least partially surrounded by a second insulated conductor wall penetrating into said semiconductor layer from the upper surface of the semiconductor layer, wherein the second insulated conductor wall includes a first portion provided with the first insulating plug at said upper surface and a second portion provided with the second insulating plug;
   a transistor having a first conduction region formed by said memory area and a second conduction region separated from the first conduction region by a channel region, where said second portion of the second insulated conductor wall at least partially surrounds the second conduction region and channel region.

9. The pixel of claim 8, wherein the second conduction region forms a read area of the pixel.

10. The pixel of claim 8, wherein said transistor further includes an insulated gate region above the channel region, and wherein said first portion of the second insulated conductor wall having the first insulating plug is provided adjacent the first conduction region of said transistor, and wherein said second portion of the second insulated conductor wall having the second insulating plug is provided adjacent the channel region and second conduction region of said transistor.

11. A pixel, comprising:
   a vertically pinned diode including a surface region doped with a first dopant type having a first depth from a top surface of a semiconductor layer doped with the first dopant type and a well region doped with a second dopant type and positioned within the semiconductor layer underneath the surface region;
   a transistor coupled to the vertically pinned diode and including a drain region doped with the second dopant type having a second depth from a top surface of a semiconductor layer, a channel region of the semiconductor layer doped with the first dopant type and an insulated gate over said channel region;
   wherein the second depth is greater than the first depth;
   a trench extending into said semiconductor layer from said top surface, said trench substantially completely surrounding said vertically pinned diode and the channel and drain regions of said transistor;
   an insulating liner on walls and a bottom of said trench;
   a conductive material within said trench;
   an insulating plug within said trench, wherein said insulating plug has third depth from said top surface at a first portion of said trench adjacent the vertically pinned diode and has a fourth depth from said top surface at a second portion of said trench adjacent the drain region;
   wherein the fourth depth is greater than the third depth, and the fourth depth is greater than the second depth.

12. The pixel of claim 11, further comprising an electrical conductor penetrating through the insulating plug at a location of the third depth for biasing the conductive material.

* * * * *